United States Patent
Xu et al.

(10) Patent No.: US 12,055,577 B2
(45) Date of Patent: Aug. 6, 2024

(54) ELECTRICAL TREE TEST DEVICE FOR SILICONE RUBBER MATERIAL FOR CABLE ACCESSORY AND METHOD FOR PREPARING SAMPLE

(71) Applicant: XI'AN JIAOTONG UNIVERSITY, Shaanxi (CN)

(72) Inventors: Man Xu, Shaanxi (CN); Sunjiaxing Wei, Shaanxi (CN); Yangtao Peng, Shaanxi (CN); Yunshun Peng, Shaanxi (CN)

(73) Assignee: XI'AN JIAOTONG UNIVERSITY, Shaanxi (CN)

( * ) Notice: Subject to any disclaimer, the term of this patent is extended or adjusted under 35 U.S.C. 154(b) by 140 days.

(21) Appl. No.: 17/956,859

(22) Filed: Sep. 30, 2022

(65) Prior Publication Data
US 2023/0026806 A1    Jan. 26, 2023

Related U.S. Application Data

(63) Continuation of application No. PCT/CN2021/085083, filed on Apr. 1, 2021.

(30) Foreign Application Priority Data

Apr. 2, 2020  (CN) .......................... 202010255785.2

(51) Int. Cl.
    *G01R 31/12*    (2020.01)
    *G01R 1/04*     (2006.01)
    *G01R 31/20*    (2006.01)

(52) U.S. Cl.
    CPC ....... *G01R 31/1272* (2013.01); *G01R 1/0408* (2013.01); *G01R 31/20* (2013.01)

(58) Field of Classification Search
    CPC .. G01R 31/1272; G01R 1/0408; G01R 31/20; G01R 31/16; G01R 31/1263; G01R 31/1218; G01R 1/02; G01R 1/0425
    See application file for complete search history.

(56) References Cited

U.S. PATENT DOCUMENTS

| | | | | |
|---|---|---|---|---|
| 4,299,713 A | * | 11/1981 | Maringer | H01B 3/46 174/110 SR |
| 4,608,306 A | * | 8/1986 | Vincent | C08K 5/54 524/265 |

(Continued)

FOREIGN PATENT DOCUMENTS

| CN | 102436161 A | 5/2012 |
|---|---|---|
| CN | 103983902 A | 8/2014 |

(Continued)

OTHER PUBLICATIONS

International Search Report dated Jul. 7, 2021 in International Application No. PCT/CN2021/085083.English translation attached.

(Continued)

*Primary Examiner* — Alvaro E Fortich

(57) ABSTRACT

Provided are an electrical tree test device for a silicone rubber material for a cable accessory and a method for preparing a sample. The method includes: adding a semi-conductive silicone rubber into xylene, performing spraying on a surface of a silicone rubber insulation sample sheet, performing a curing processing, cutting the sample sheet into a high-voltage electrode with a triangular longitudinal section end, then adhering the high-voltage electrode on the surface of the silicone rubber insulation sample sheet, and performing a high temperature vulcanization to obtain a silicon rubber sample sheet; placing the silicon rubber sample sheet into a mold, injecting a high temperature vulcanizable liquid silicone rubber mixture, and performing the high temperature vulcanization, to obtain a sample; and (Continued)

performing cutting at a position distanced from a tip of the high-voltage electrode by 2 mm, and adhering a ground electrode of a flat plate-like structure at the cross section.

10 Claims, 1 Drawing Sheet

(56) References Cited

U.S. PATENT DOCUMENTS

| 10,514,534 | B2 | 12/2019 | Ben Ezra et al. | |
|---|---|---|---|---|
| 2017/0137595 | A1* | 5/2017 | Andersson | C08K 3/04 |
| 2017/0336466 | A1* | 11/2017 | Nakaji | G01R 31/20 |
| 2018/0292342 | A1* | 10/2018 | Mura | G01N 27/205 |

FOREIGN PATENT DOCUMENTS

| CN | 104880656 A | 9/2015 |
|---|---|---|
| CN | 104965162 A | 10/2015 |
| CN | 205786911 U | 12/2016 |
| CN | 205898695 U | 1/2017 |
| CN | 106501277 A | 3/2017 |
| CN | 108957263 A | 12/2018 |
| CN | 208239533 U | 12/2018 |
| CN | 111308294 A | 6/2020 |
| JP | 2001066255 A | 3/2001 |
| JP | 2005003548 A | 1/2005 |

OTHER PUBLICATIONS

First Office Action from corresponding Chinese Application No. 202010255785.2, dated Oct. 22, 2020. English translation attached.
The Grant Notice & Supplementary search from corresponding Chinese Application No. 202010255785.2, dated Nov. 25, 2020. English translation attached.
Liu, Ying et al. 'Performance Change and Failure Mechanism of Ethylene Propylene-Diene Monomer under Interfacial Multi-Stresses', Journal of Xi'an Jiaotong University, vol. 53, No. 10, Oct. 31, 2019 (Oct. 31, 2019).
Bian, Haiyuan 'The Preparation and Electrical Property of Acetophenone Vinyl Oxygen Radicals/PE Grafted Compounds', China Excellent Master's Thesis Full-text Database Engineering Science and Technology II, vol. 03, Mar. 15, 2017 (Mar. 15, 2017).

* cited by examiner

ELECTRICAL TREE TEST DEVICE FOR SILICONE RUBBER MATERIAL FOR CABLE ACCESSORY AND METHOD FOR PREPARING SAMPLE

CROSS-REFERENCE TO RELATED APPLICATIONS

This application is a continuous application of PCT international Application No. PCT/CN2021/085083, filed on Apr. 1, 2021, which claims priority to Chinese Patent Application No. 202010255785.2 filed on Apr. 2, 2020, the entire disclosure of which is incorporated herein by reference for all purposes.

FIELD

The present disclosure relates to an electrical tree test device for a silicone rubber material for a cable accessory and a method for preparing a sample, which belongs to the technical field of an electricity-resistant tree performance research of an insulation material.

BACKGROUND

With increasing maturity of a high-voltage power cable and accessory production technology thereof in our nation, a high-voltage cable gradually replaces an overhead line, and becomes a main channel for an electricity transmission in the cities and thus the using of a cable accessory increases accordingly. The cable accessory is the most fragile component of an electric power system. 70% of the electric power system faults are caused by a fault of the cable accessory. A mainstream view considers that the fault of the cable accessory is mainly caused by an electrical tree generated inside the accessory. An installation of the existing cable accessory is mostly done by a prefabricated structure. A silicone rubber becomes a main material of a prefabricated cable accessory due to its excellent mechanical performance and electrical performance. The prefabricated accessory may be designed to have a predetermined magnitude of interference, to ensure that a contact surface between a cable body and the accessory has enough interface pressure in an operation process. This leads to that a vicinity of the cable is influenced by factors such as heat, electricity, and great mechanical stress, etc. for a long time in the operation process. After a long operation time, an internal cross-linked structure of the silicone rubber is damaged to form a weak area due to material degradation, which in turn may generate the electrical tree and cause a breakdown fault in the cable accessory. Therefore, there is a clear practical meaning for studying an electrical tree characteristic of the cable accessory under mechanical stress.

In the related art, a tensile device is adopted during researching an electrical tree test of an insulating material. A pressure is applied to a pressing rod through adjusting a bolt to fix an end of a sample into a groove. A structure of this pressing rod has obvious defects during fixing the sample. That is, the pressing rod may rotate during fastening by the bolt and drive the sample in the groove to move, which may result in different lengths of two sides of the sample, uneven stress distribution on the deformed sample, and a wrinkle generated on a surface of the sample. Thus, a test result is affected. Moreover, due to restriction of the size of the groove and the volume of the pressing rod, the device is suitable for fixing a sheet-shaped sample with a relatively thin thickness. However, for the electrical tree sample, a ground electrode of a sufficient width is required for ensuring a uniform region electric field generated by an electric tree. In this case, the electric tree branch sample has a relatively thick thickness and is not easily placed into the groove to be fixed.

In an aspect of an electrical tree test sample, a needle-plate electrode structure sample made of steel needles is widely used at present. Due to the fact that the silicone rubber material belongs to a superelastic material and has a low tear resistance strength, when the steel needle serves as a high-voltage electrode, under great mechanical deformation, a crack and an air gap are easily generated at a tip of the needle, and even if the sample is torn at the tip of the needle, thereby seriously affecting the test result. Individual researchers use the steel needle to manufacture a silicone rubber sample of the needle-plate electrode structure, and study initiation and growth characteristics of a silicone rubber electric tree under a compressive force and tensile deformation. However, a maximum tensile ratio of the silicone rubber sample is 30%, which is far smaller than a diameter expansion rate of about 45% of a common high-voltage cable accessory. In this case, an electrical tree characteristic of the deformed cable accessory can not be reflected, and it is difficult to realize a test of great mechanical deformation.

SUMMARY

Technical Problems

In order to overcome problems in the related art, embodiments of the present disclosure are to provide an electrical tree test device for a silicone rubber material for a cable accessory and a method for preparing a sample.

Technical Solutions

According to the present disclosure, the following technical solutions are adopted.

An electrical tree test device for a silicone rubber material for a cable accessory is provided. The electrical tree test device includes an insulation oil bath tank, a power wire, a digital microscopic imaging system, and a tensile test device configured to stretch an electrical tree test sample. The digital microscopic imaging system includes: a microscope lens disposed above the tensile test device; a cold light source disposed below the insulation oil bath tank; and a computer connected to the microscope lens. The power wire includes: a high-voltage power wire, in which one end of the high-voltage power wire is connected to a high-voltage power supply, and another end of the high-voltage power wire is connected to a high-voltage electrode of the electrical tree test sample; and a grounding wire, in which one end of the grounding wire is grounded, and another end of the grounding wire is connected to a ground electrode of the electrical tree test sample. The tensile test device is disposed in the insulation oil bath tank, and includes two tensile members that are symmetrically arranged. Each of the tensile members includes: a movable screw rod; an adjusting nut; a vertical plate arranged vertically; and a slider located between the vertical plates of the two tensile members. One end of the movable screw rod penetrates the slider, and another end of the movable screw rod penetrates the vertical plate. The adjusting nut is disposed on the other end of the movable screw rod penetrating the vertical plate. The vertical plates of the two tensile members are connected to each other by a support rod.

In some embodiments of the present disclosure, the tensile test device is made of an insulating material. The movable screw rod is made of hard organic glass. The adjusting nut is made of nylon. The vertical plate and the support rod are made of epoxy resin.

In some embodiments of the present disclosure, the slider includes a fastening bolt, an upper slider, and a lower slider. The upper slider is disposed on the lower slider and fixed to the lower slider by the fastening bolt. The movable screw rod penetrates the lower slider and is fixed to the lower slider.

In some embodiments of the present disclosure, a rectangular protrusion is provided on a bottom of the upper slider, and a rectangular groove is defined on a top of the lower slider and matching with the rectangular protrusion. The vertical plates of the two tensile members are arranged in parallel to each other and connected by the support rod. Two sliders are arranged between the vertical plates of the two tensile members.

In some embodiments of the present disclosure, the insulation oil bath tank has a cuboid cavity opened upwards, and a through hole is defined on a bottom of the cavity. A transparent inorganic glass is disposed in the through hole. The cold light source is disposed below the transparent inorganic glass.

A method for preparing an electrical tree test sample of a silicone rubber material for a cable accessory is provided. The method includes: step 1: adding a semi-conductive silicone rubber into xylene, stirring evenly, then spraying the mixture uniformly onto a surface of a silicone rubber insulation sample sheet, and then performing a curing processing, to obtain a sample sheet coated with a semi-conductive coating; step 2: cutting the sample sheet coated with the semi-conductive coating into a high-voltage electrode with a triangular longitudinal section end, then adhering the high-voltage electrode on a surface of a silicone rubber insulation sample sheet, and performing a high temperature vulcanization processing, to obtain a silicon rubber sample sheet adhered with the high-voltage electrode; and step 3: placing the silicone rubber sample sheet adhered with the high-voltage electrode into a mold, injecting a high temperature vulcanizable liquid silicone rubber mixture into the mold, and performing the high temperature vulcanization processing, to obtain a sample, and then cutting the sample at a position distanced from a tip of the high-voltage electrode by 2 mm, and adhering a ground electrode of a flat plate-like structure at a cross section of the cut sample, to obtain the electrical tree test sample of the silicone rubber material for the cable accessory.

In some embodiments of the present disclosure, in steps 1 and 2, the silicone rubber insulation sample sheet is prepared by mixing a component A and a component B by a mass ratio of 1:1 to form the high temperature vulcanizable liquid silicone rubber mixture, injecting the high temperature vulcanizable liquid silicone rubber mixture into the mold, and then performing the high temperature vulcanization at a temperature of 175° C. for 30 min.

In some embodiments of the present disclosure, in the step 1, a mass ratio of the semi-conductive silicone rubber to the xylene is 1:12, the curing processing is performed at a temperature of 175° C. for 30 min, and the semi-conductive coating has a thickness ranging from 10 μm to 15 μm.

In some embodiments of the present disclosure, in the step 2, the triangular longitudinal section end of the high-voltage electrode has a vertex angle of 30°, and the high temperature vulcanizable liquid silicone rubber mixture is used for the adhesion.

In some embodiments of the present disclosure, in the step 2 and the step 3, the high temperature vulcanization processing is performed at a temperature of 175° C. or 30 min.

Beneficial Effects

Compared with the prior art, the present disclosure has the following beneficial effects.

In the present disclosure, the slider is designed to include the upper slider and the lower slider, which is suitable for clamping samples with different thicknesses, and can also enable the sample with the relatively thicker thickness to be deformed by 0-125%. A deformation range may cover a deformation amount of about 45% of an actual cable accessory. Therefore, an electrical tree characteristic of the silicone rubber sample can be studied in a greater mechanical deformation range. A spacing distance between the upper slider and the lower slider is convenient to be adjusted. Therefore, there is low requirement for the thickness of the sample, and the sample can be easily clamped. Therefore, the sliders of the present disclosure can be applied to an electrical tree sample with a relatively thick thickness.

Further, the rectangular protrusion of the upper slider may be embedded into the rectangular groove of the lower slider, and the upper slider and the lower slider are fixed together by the fastening bolt. Therefore, it is possible to greatly improve a cooperation between the upper slider and the lower slider, and increase a friction force of the electric tree branch sample between the sliders to prevent the sample from slipping during tensile deformation.

The sample according to the present disclosure can reach an actual deformation of the cable accessory on a mechanical deformation dimension, and an electrode material is also consistent with an initiation material of the electrical tree of the actual cable accessory. Further, the electrode can be accurately controlled in shape. Thus, it is possible to facilitate simulating an initiation and growth process of the electrical tree of the actual cable accessory under the mechanical stress.

The semi-conductive electrode obtained by the present disclosure can be accurately controlled in shape, and can not be deformed due to a great pressure generated during an injection by means of a high-pressure injection gun. A material of a tip of the high-voltage electrode is formed by a disposable molding vulcanization, which is consistent with an actual manufacturing process of the cable accessory. When the electric tree sample of the obtained semi-conductive high-voltage electrode is subjected to the great mechanical deformation, the high-voltage electrode and the silicone rubber insulation material change synchronously, and thus a problem of bubble and crack caused by a separation of the conductive electrode from the insulation material would not occur. According to the present disclosure, a great mechanical deformation of the electrical tree sample having the semi-conductive electrode can be obtained, and the great mechanical deformation can be provided for the electrical tree sample in cooperation with the improved insulation tensile test device. Therefore, it is possible to facilitate simulating the initiation and growth process of the electrical tree of the actual high-voltage cable accessory under a diameter expansion to solve the problems in the related art.

Further, screw threads are formed on the movable screw rod, and rotating the adjusting nut can control a movement of the movable screw rod, thereby changing a position of the slider to enable the mechanical deformation of the electrical tree sample. The two vertical plates and the four support rods can provide supporting and fixing, so that the sliders are movable horizontally along the support rods. The two vertical plates must be strictly kept parallel to each other, to ensure that the sample is kept as straight as possible in the tensile process.

REFERENCE NUMERALS

20: insulation oil bath tank; 30: tensile test device; 31: movable screw rod; 32: adjusting nut; 33: vertical plate; 34: support rod; 351: fastening bolt; 352: upper slider; 353: lower slider; 36: electrical tree sample; 41: high-voltage power wire; 42: grounding wire; 51: microscope lens; 52: cold light source; 53: computer.

DETAILED DESCRIPTION

Technical solutions according to embodiments of the present disclosure will be described below in combination with accompanying drawings of the embodiments of the present disclosure. The described embodiments are only a part, rather than all, of the embodiments of the present disclosure. On a basis of the embodiments in the present disclosure, all other embodiments obtained by a person skilled in the art without creative steps shall fall within the scope of the present disclosure.

Figure 1:
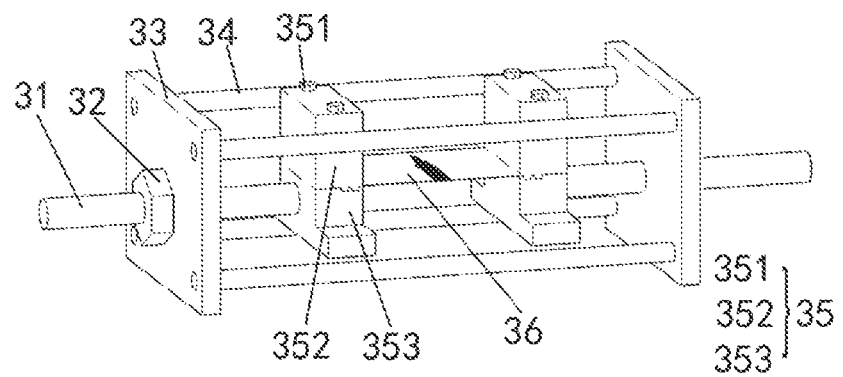
FIG. 1 is a schematic structural view showing a tensile test device.
Figure 2:
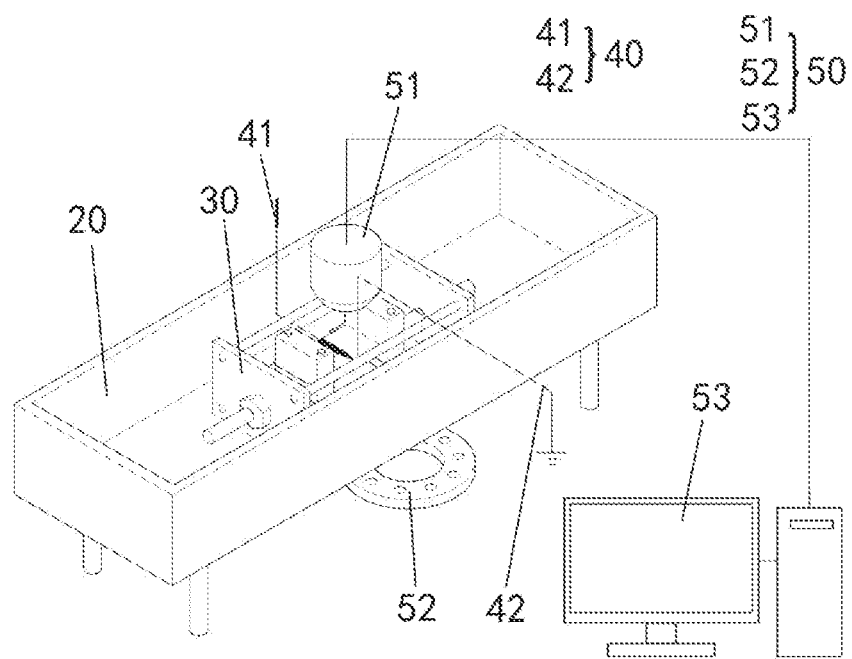
FIG. 2 is a schematic structural view showing an electrical tree test device for a silicone rubber material for a cable accessory according to the present disclosure.

Referring to FIG. 1 to FIG. 2, the present disclosure provides an electrical tree test device for a silicone rubber material for a cable accessory. The electrical tree test device includes an insulation oil bath tank 20, a tensile test device 30, a power wire, and a digital microscopic imaging system.

The digital microscopic imaging system is configured to monitor an initiation and growth process of an electrical tree sample 36 in real time, and mainly includes a microscope lens 51, a cold light source 52, and a computer 53. The microscope lens 51 is disposed above the tensile test device 30, and is configured to monitor the electrical tree sample 36 and connected to the computer 53.

The power wire includes a high-voltage power wire 41 and a grounding wire 42. The high-voltage power wire 41 is configured to connect a high-voltage power supply and a tapered semi-conductive high-voltage electrode of the electrical tree sample 36. The grounding wire 42 is connected to a flat plate-like ground electrode of the electrical tree sample 36.

The insulation oil bath tank 20 is made of an epoxy material as a whole. The insulation oil bath tank 20 is a cuboid cavity opened upwards. A through hole is defined at a center of a bottom of the cavity. A circular transparent inorganic glass of a same size as the thorough hole is provided in the through hole. The cold light source 52 is arranged below the circular transparent inorganic glass. A light from the cold light source 52 may enter the insulation oil bath tank 20 through the transparent inorganic glass and is irradiated onto the electrical tree sample 36

The tensile test device 30 is disposed in the insulation oil bath tank 20.

Referring to FIG. 1, the tensile test device 30 includes two tensile members that are symmetrically arranged. Each of the tensile members includes a movable screw rod 31, an adjusting nut 32, a vertical plate 33, a support rod 34, and a slider. The whole tensile test device 30 is made of an insulation material.

The two vertical plate 33 are vertically arranged in parallel to each other, and connected by four support rods 34. Two sliders are arranged between the two vertical plates 33. One end of one of the movable screw rods 31 penetrates one of the two sliders, and the other end of the movable screw rod 31 penetrates one of the two vertical plate 33. The adjusting nut 32 is arranged on the on the end of the movable screw rod 31 penetrating the vertical plate 33.

Similarly, one end of the other movable screw rod 31 penetrates the other slider. Another end of the screw rod 31 penetrates the other vertical plate 33, and a further adjusting nut 32 is arranged on the end of the screw rod 31 penetrating the vertical plate 33. The structure of the disclosure is symmetrical.

Each slider includes a fastening bolt 351, an upper slider 352, and a lower slider 353. The upper slider 352 is arranged on the lower slider 353. The upper slider 352 and the lower slider 353 are fixed together by the fastening bolt 351. The movable screw rod 31 penetrates the lower slider 353 and is fixed to the lower slider 353.

The upper slider 352 and the lower slider 353 are configured to clamp the electrical tree sample 36. A rectangular protrusion is arranged on a bottom of the upper slider 352. A rectangular groove is defined on a top of the lower slider 353, and matches with the rectangular protrusion. The rectangular protrusion of the upper slider 352 may be embedded into the rectangular groove of the lower slider 353, and the upper slider 352 and the lower slider 353 are fixed together by the fastening bolt 351. Therefore, it is possible to greatly improve a cooperation between the upper slider 352 and the lower slider 353, and increase a friction force of the electric tree branch sample 36 between the sliders to prevent the sample from slipping during tensile deformation. Thus, a deformation of 0-125% may be applied to a relatively thicker sample. In addition, a deformation range may cover a deformation amount of about 45% of an actual cable accessory. Therefore, an electrical tree characteristic of the silicone rubber sample can be studied in a greater mechanical deformation range. A spacing distance between the upper slider 352 and the lower slider 353 is convenient to be adjusted. Therefore, there is low requirement for a thickness of the sample, and the sample can be easily clamped. Therefore, the sliders of the present disclosure can be applied to an electrical tree sample with a relatively thick thickness.

The movable screw rod 31 is made of hard organic glass. The adjusting nut 32 is made of nylon. The vertical plates 33 and the support rods 34 are made of epoxy resin.

Screw threads are formed on the movable screw rod, and rotating the adjusting nut 32 can control a movement of the movable screw rod 31, thereby changing a position of the slider to enable a mechanical deformation of the electrical tree sample 36. The two vertical plates 33 and the four support rods 34 can provide supporting and fixing, so that the sliders are movable horizontally along the support rods 34. The two vertical plates 33 must be strictly kept parallel to each other, to ensure that the sample is kept as straight as possible in the tensile process.

A method for preparing an electrical tree test sample of a silicone rubber material for a cable accessory is provided, including the steps as follows.

At step 1, firstly, a component A and a component B is mixed by a mass ratio of 1:1 to form a high-temperature vulcanizable liquid silicone rubber mixture, then the high-temperature vulcanizable liquid silicone rubber mixture is injected into a rectangular mold through a high-pressure injection gun after removing bubbles through a high pressure, in which the mold has a cavity with a height of 1 mm, and then a vulcanization processing is performed at a temperature of 1.75° C. for 30 min, and then a natural cooling is performed, to obtain two silicone rubber insulation sample sheet with a thickness of 1 mm.

At step 2, a semi-conductive silicone rubber is added to xylene, and the resulted, mixture is diluted so that a mass ratio of the semi-conductive silicone rubber to the xylene is 1:12. After stirred evenly, the resulted mixture is injected into a high-pressure spray gun, and is sprayed uniformly onto one surface of the silicone rubber insulation sample sheet with the thickness of 1 mm. Thereafter, the vulcanization processing is performed at the temperature of 175° C., and a curing processing is performed for 30 min, and then the natural cooling to room temperature is performed, to form a coating on the one surface of the silicone rubber insulation sample sheet with the thickness of 1 mm. In this way, a sample sheet coated with a semi-conductive coating on one surface thereof can be obtained, and the semi-conductive coating has a thickness ranging from 10 μm to 15 μm.

At step 3, the sample sheet coated with the semi-conductive coating is cut into a pointed conical high-voltage electrode with a triangular cross section end. The cross section end has a triangle upper part with a vertex angle of 30°. The high-temperature vulcanizable liquid silicone rubber mixture is applied on a surface of the sample sheet without the semi-conductive coating (namely, the other surface of the sample sheet opposite to the surface coated with the semi-conductive coating) in such a manner that the component A and the component B are mixed with each other by the mass ratio of 1:1, and is adhered onto the surface of the silicone rubber insulation sample sheet with the thickness of 1 mm, is vulcanized at a temperature of 175° C. for 30 min to fix the point conical high-voltage electrode. In this way, a silicon rubber sample sheet adhered with the high-voltage electrode can be obtained.

At step 4, the silicone rubber sample sheet adhered with the high-voltage electrode is placed into a mold with a thickness of 4 mm, and the high-temperature vulcanizable liquid silicone rubber mixture is injected by means of the high-pressure injection gun. Then, a hating at a temperature of 175° C. is performed for 30 min, then a natural cooling operation to the room temperature is performed to obtain a sample. Thereafter, the sample is cut at a position distanced from a tip of the high-voltage electrode by 2 mm, then a flat plate-like ground electrode made of copper foil or conductive rubber is adhered to a cross-section of the cut sample, to obtain the electrical tree sample 36.

A test method will be described below.

Two ends of the electrical tree sample 36 are disposed between the upper and lower sliders of the tensile test device 30, and the fastening bolt 351 is fastened to prevent the electrical tree sample 36 from slipping during the tensile deformation.

The adjusting nut 32 is turned to adjust the electrical tree sample 36 to be in a natural stretching state, and a length of the sample between the two sliders is measured.

The tensile ratio is set in a range of 0%, 15%, 30%, 45%, 60% and 75% with reference to the cable accessory (the common diameter expansion rate is 45%). The adjusting nut 32 is turned to adjust a spacing distance between the two sliders to allow the sample reaches a corresponding tensile ratio.

The tensile test device 30 loaded with the electrical tree sample 36 is placed into the insulation oil bath tank 20, and then silicone oil is poured until the electrical tree sample 36 is immersed by the silicone oil, thereby ensuring that the test sample may not have surface flashover and that surface defects of the tensile test device 30 may be compensated by the silicone oil to prevent an observation result from being interfered due to surface damage and defects.

The high-voltage power wire 41 (which is configured to connect the high-voltage power supply to the pointed conical semi-conductive high-voltage electrode of the electrical tree sample 36) and the grounding wire 42 are switched on to start pressure to perform the test, and a test result is recorded continuously by a digital microscope camera system.

The initiation and growth process of the electrical tree can be observed by real-time monitoring of the digital microscopic camera system, such as an electrical tree initiation process, a growth pattern of the electrical tree, and whether the sample has been broken down.

In order to solve the problem that great mechanical deformation is generated when the high-temperature vulcanizable liquid silicone rubber mixture for the high-voltage cable accessory is relatively thick, and the problem that the test result is interfered due to the air gap and the crack generated at the tip of the needle in test technology of the needle-plate structure under the great mechanical deformation, the present disclosure is proposed. According to related accident analysis report of the cable accessory, the electric tree of the cable accessory is usually grown at an interface between the semi-conductive structure and an insulation layer, and is initiated by microscopic defects of the semi-conductive surface to grow up towards the insulation layer. By adopting the sample and the test device of the present disclosure, an actual deformation of the cable accessory can be achieved on a mechanical deformation dimension, an electrode material is also consistent with an initiation material of the electrical tree of the actual cable accessory. Further, the electrode can be accurately controlled in shape. Thus, it is possible to facilitate simulating an initiation and growth process of the electrical tree of the actual cable accessory under the mechanical stress. The present disclosure can realize that the initiation and growth process of the electrical tree of the silicone rubber material of the high-voltage cable accessory can be observed in real time under the great mechanical deformation.

What is claimed is:

1. An electrical tree test device for a silicone rubber material for a cable accessory, the electrical tree test device comprising an insulation oil bath tank, a power wire, a digital microscopic imaging system, and a tensile test device configured to stretch an electrical tree test sample,
    wherein the digital microscopic imaging system comprises:
        a microscope lens disposed above the tensile test device;
        a cold light source disposed below the insulation oil bath tank; and
        a computer connected to the microscope lens,
    wherein the power wire comprises:
        a high-voltage power wire, one end of the high-voltage power wire being connected to a high-voltage power supply, and another end of the high-voltage power wire being connected to a high-voltage electrode of the electrical tree test sample; and
        a grounding wire, one end of the grounding wire being grounded, and another end of the grounding wire being connected to a ground electrode of the electrical tree test sample, and wherein the tensile test device is disposed in the insulation oil bath tank, and comprises two tensile members that are symmetrically arranged, each of the tensile members comprising:

a movable screw rod;

an adjusting nut;

a vertical plate arranged vertically; and a slider located between the vertical plates of the two tensile members, one end of the movable screw rod penetrating the slider, and another end of the movable screw rod penetrating the vertical plate, wherein the adjusting nut is disposed on the other end of the movable screw rod penetrating the vertical plate, and the vertical plates of the two tensile members are connected to each other by a support rod.

2. The electrical tree test device for the silicone rubber material for the cable accessory according to claim 1, wherein:

the tensile test device is made of an insulating material;

the movable screw rod is made of hard organic glass;

the adjusting nut is made of nylon; and the vertical plate and the support rod are made of epoxy resin.

3. The electrical tree test device for the silicone rubber material for the cable accessory according to claim 1, wherein:

the slider comprises a fastening bolt, an upper slider, and a lower slider;

the upper slider is disposed on the lower slider and fixed to the lower slider by the fastening bolt; and the movable screw rod penetrates the lower slider and is fixed to the lower slider.

4. The electrical tree test device for the silicone rubber material for the cable accessory according to claim 3, wherein:

a rectangular protrusion is provided on a bottom of the upper slider;

a rectangular groove is defined on a top of the lower slider and matching with the rectangular protrusion;

the vertical plates of the two tensile members are arranged in parallel to each other and connected by the support rod; and two sliders are arranged between the vertical plates of the two tensile members.

5. The electrical tree test device for the silicone rubber material for the cable accessory according to claim 1, wherein:

the insulation oil bath tank has a cuboid cavity opened upwards, a through hole being defined on a bottom of the cavity;

a transparent inorganic glass is disposed in the through hole; and the cold light source is disposed below the transparent inorganic glass.

6. A method for preparing an electrical tree test sample of a silicone rubber material for a cable accessory, the method comprising:

step 1: adding a semi-conductive silicone rubber into xylene, stirring evenly, then spraying the mixture uniformly onto a surface of a silicone rubber insulation sample sheet, and then performing a curing processing, to obtain a sample sheet coated with a semi-conductive coating;

step 2: cutting the sample sheet coated with the semi-conductive coating into a high-voltage electrode with a triangular longitudinal section end, then adhering the high-voltage electrode on a surface of a silicone rubber insulation sample sheet, and performing a high temperature vulcanization processing, to obtain a silicon rubber sample sheet adhered with the high-voltage electrode; and step 3: placing the silicone rubber sample sheet adhered with the high-voltage electrode into a mold, injecting a high temperature vulcanizable liquid silicone rubber mixture into the mold, and performing the high temperature vulcanization processing, to obtain a sample, and then cutting the sample at a position distanced from a tip of the high-voltage electrode by 2 mm, and adhering a ground electrode of a flat plate-like structure at a cross section of the cut sample, to obtain the electrical tree test sample of the silicone rubber material for the cable accessory.

7. The method for preparing the electrical tree test sample of the silicone rubber material for the cable accessory according to claim 6, wherein in steps 1 and 2, the silicone rubber insulation sample sheet is prepared by:

mixing a component A and a component B to form the high temperature vulcanizable liquid silicone rubber mixture by a mass ratio of 1:1;

injecting the high temperature vulcanizable liquid silicone rubber mixture into the mold; and performing the high temperature vulcanization processing at a temperature of 175° C. for 30 min.

8. The method for preparing the electrical tree test sample of the silicone rubber material for the cable accessory according to claim 6, wherein in the step 1:

a mass ratio of the semi-conductive silicone rubber to the xylene is 1:12;

the curing processing is performed at a temperature of 175° C. for 30 min; and the semi-conductive coating has a thickness ranging from 10 μm to 15 μm.

9. The method for preparing the electrical tree test sample of the silicone rubber material for the cable accessory according to claim 7, wherein in the step 2, the triangular longitudinal section end of the high-voltage electrode has a vertex angle of 30°, and the high temperature vulcanizable liquid silicone rubber mixture is used for the adhesion.

10. The method for preparing the electrical tree test sample of the silicone rubber material for the cable accessory according to claim 6, wherein in the step 2 and the step 3, the high temperature vulcanization processing is performed at a temperature of 175° C. or 30 min.

* * * * *